United States Patent
Park

(10) Patent No.: US 8,125,827 B2
(45) Date of Patent: Feb. 28, 2012

(54) FLASH MEMORY SYSTEMS AND OPERATING METHODS USING ADAPTIVE READ VOLTAGE LEVELS

(75) Inventor: Kitae Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 318 days.

(21) Appl. No.: 12/490,896

(22) Filed: Jun. 24, 2009

(65) Prior Publication Data

US 2010/0020611 A1    Jan. 28, 2010

(30) Foreign Application Priority Data

Jul. 23, 2008   (KR) ............................ 10-2008-71758

(51) Int. Cl.
G11C 11/34 (2006.01)
(52) U.S. Cl. ......... 365/185.09; 365/185.03; 365/185.11; 365/185.17; 365/185.2; 365/185.22; 365/185.24; 365/189.011; 365/185.33
(58) Field of Classification Search ............. 365/185.03, 365/185.09, 185.11, 185.17, 185.2, 185.22, 365/185.24, 189.011, 185.33
See application file for complete search history.

(56) References Cited

U.S. PATENT DOCUMENTS

| 2006/0152981 A1 | 7/2006 | Ryu | |
|---|---|---|---|
| 2008/0126676 A1* | 5/2008 | Li et al. | 711/103 |
| 2008/0192541 A1* | 8/2008 | Kang et al. | 365/185.03 |

FOREIGN PATENT DOCUMENTS

| JP | 08-235871 | 9/1996 |
|---|---|---|
| JP | 2005-196886 | 7/2005 |
| KR | 10-1997-0076866 | 12/1997 |
| KR | 1020040079464 A | 9/2004 |
| KR | 1020080035828 A | 4/2008 |

OTHER PUBLICATIONS

ISSCC 2006 / Session 7 / Non-Volatile Memory / 7.1; IEEE International Solid-State Circuits Conference (2006); pp. 132-133; 644.
Eitan et al.; *4-bit per Cell NROM Reliability*; IEEE (2005).

* cited by examiner

*Primary Examiner* — Fernando Hidalgo
(74) *Attorney, Agent, or Firm* — Myers Bigel Sibley & Sajovec, P.A.

(57) ABSTRACT

Some embodiments of the present invention provide methods of operating nonvolatile memory devices. Reference data is stored in a plurality of memory cells. The reference data is read, and a threshold voltage distribution of the plurality of memory cells is determined responsive to reading the reference data. A read voltage of the nonvolatile memory device is modified based on the determined threshold voltage distribution. The nonvolatile memory device may include a main region configured to stored data and a dummy region configured to store the reference data, and the methods may further include reading data from the main region using the modified read voltage.

8 Claims, 15 Drawing Sheets

FLASH MEMORY SYSTEMS AND OPERATING METHODS USING ADAPTIVE READ VOLTAGE LEVELS

CROSS-REFERENCE TO RELATED APPLICATIONS

This U.S. non-provisional patent application claims priority under 35 U.S.C. §119 of Korean Patent Application No. 10-2008-71758 filed on Jul. 23, 2008, the entire contents of which are incorporated herein by reference.

BACKGROUND

The present invention relates to memory devices and methods of operating the same and, more particularly, to nonvolatile flash memory devices and methods of operating the same.

Nonvolatile flash memory devices are types of electrically erasable and programmable read-only memories (EEPROMs) in which pluralities of memory regions may be erased or written with data in a one-time programming operation. A typical traditional EEPROM, however, may be configured such that only one memory region is erasable or programmable at a time. This means that flash memories may operate more rapidly and effectively in reading and writing data when systems employing them read/write data from/into different memory regions at the same time. Commonly, flash memories or EEPROMs are configured such that insulation films enclosing charge storage elements used for storing data are worn out after the specific number of operations.

Flash memories typically retain stored information even without power supply. In other words, flash memories typically are able to retain their information without power consumption even when power to the chip is interrupted. Additionally, flash memories may be relatively resistant to physical impacts, offering fast accessibility for reading. With those advantageous properties, the flash memories are commonly used as storage units in battery-powered devices.

A typical flash memory device is configured to store information in an array of transistors that are called cells, each cell configured to store at least 1-bit of data. A multi-level cell (MLC) flash memory device may be capable of storing more than 1 bit by varying an amount of charge accumulated in floating gate of a memory cell.

In a flash memory device using floating gate technology, data retention characteristics and endurance (the permissible number of programming/erasing cycles without degradation in operation quality) are generally important. Charge (electrons) accumulated in a floating gate may leak out due to various fail mechanisms, such as thermal ion release and charge diffusion through defective an inter-poly insulation film, ionic impurities, stress due to program disturbance, and other mechanisms. Such leakage of charge may result in reduction of threshold voltage.

When a power source voltage is applied to a control gate of a flash memory cell, charge acquisition may occur, which may lead to an elevation of threshold voltage. Repetitive programming/erasing cycles may force oxide films of memory transistors to be stressed, generating failures, such as tunnel oxide breakdown, in the flash memory device. Threshold voltages of memory cells gradually decline due to the stress. In other words, charges may more easily leak from the floating gates of programmed memory cells due to the stress to the oxide films. As a result, a threshold voltage distribution of the programmed memory cells may shift, which may cause some memory cells to have a threshold voltage less than a program-verifying voltage. This can result in a read failure due to reduction of read margin.

SUMMARY

Some embodiments of the present invention provide methods of operating nonvolatile memory devices. Reference data is stored in a plurality of memory cells. The reference data is read, and a threshold voltage distribution of the plurality of memory cells is determined responsive to reading the reference data. A read voltage of the nonvolatile memory device is modified based on the determined threshold voltage distribution. The nonvolatile memory device may include a main region configured to store data and a dummy region configured to store the reference data, and the methods may further include reading the data from the main region using the modified read voltage.

According to further embodiments, determining a threshold voltage distribution of the plurality of memory cells responsive to reading the reference data includes detecting a maximum value of the threshold voltage distribution. Modifying a read voltage of the nonvolatile memory device based on the determined threshold voltage distribution includes modifying the read voltage based on the detected maximum value of the threshold voltage distribution. Detecting a maximum value of the threshold voltage distribution may include reading the plurality of memory cells using a first read voltage and responsively determining a first number of cells meeting a predetermined criterion in response to the reading of the plurality of memory cells using the first read voltage. The plurality of cells may be subsequently read using a second read voltage differing from the first read voltage by a predetermined voltage difference and a second number of cells meeting the predetermined criterion may be determined responsive to the reading of the plurality of cells using the second read voltage. The maximum value of the threshold voltage distribution may be determined responsive to a comparison of the first number of cells and the second number of cells.

Detecting a maximum value of the threshold voltage distribution may include detecting a first maximum value of a first threshold voltage distribution and a second maximum value of a second threshold voltage distribution. Modifying the read voltage based on the detected maximum value of the threshold voltage distribution may include modifying the read voltage based on the first and second maximum values. For example, modifying the read voltage based on the first and second maximum values may include determining an average of the first and second maximum values and modifying the read voltage based on the determined average.

Further embodiments of the present invention provide additional methods of operating nonvolatile memory devices. The methods include determining whether data read from the nonvolatile memory device is correctable by error correction coding (ECC) and, if the data is not correctable by ECC, reading reference data from a plurality of memory cells of the nonvolatile memory device to determine a threshold voltage distribution of the plural memory cells and modifying a read voltage used to read data from the nonvolatile memory device based on the determined threshold voltage distribution. The methods may further include detecting a writable one of the plurality of data blocks and refreshing data of the detected writable block.

Additional embodiments of the present invention provide nonvolatile memory devices, including a first plurality of memory cells, a second plurality of memory cells and a memory control circuit configured to store reference data in the first plurality of memory cells, to read the reference data, to determine a threshold voltage distribution of the first plurality of memory cells responsive to reading the reference data and to control a read voltage applied to the second plurality of memory cells based on the determined threshold voltage distribution. The memory control circuit may be configured to detect a maximum value of the threshold voltage distribution to modify the read voltage based on the detected maximum value of the threshold voltage distribution.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF EMBODIMENTS

Figure 1A:
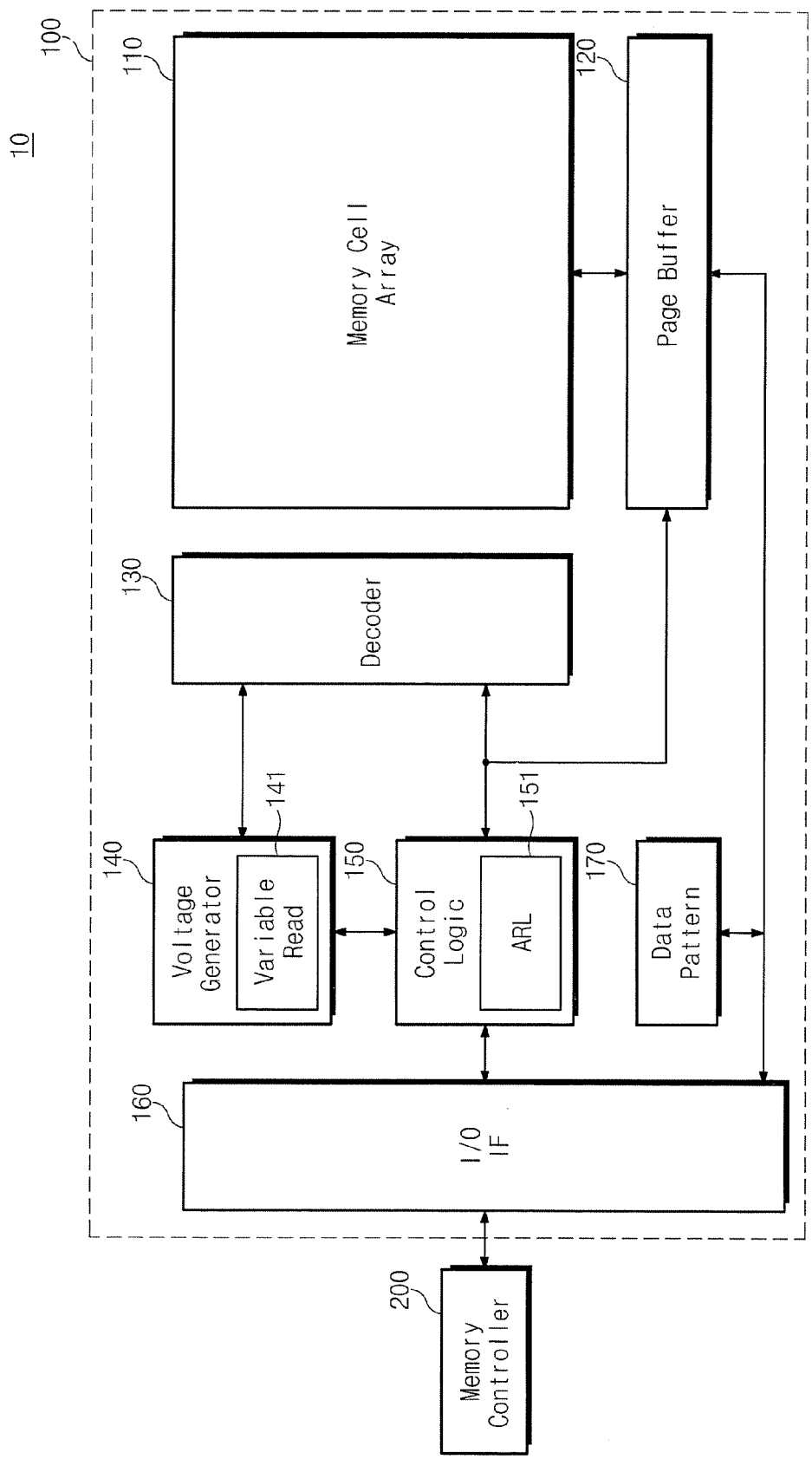
FIGS. 1A and 1B are block diagrams of memory systems according to some embodiments of the present invention.

Embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Figure 1B:
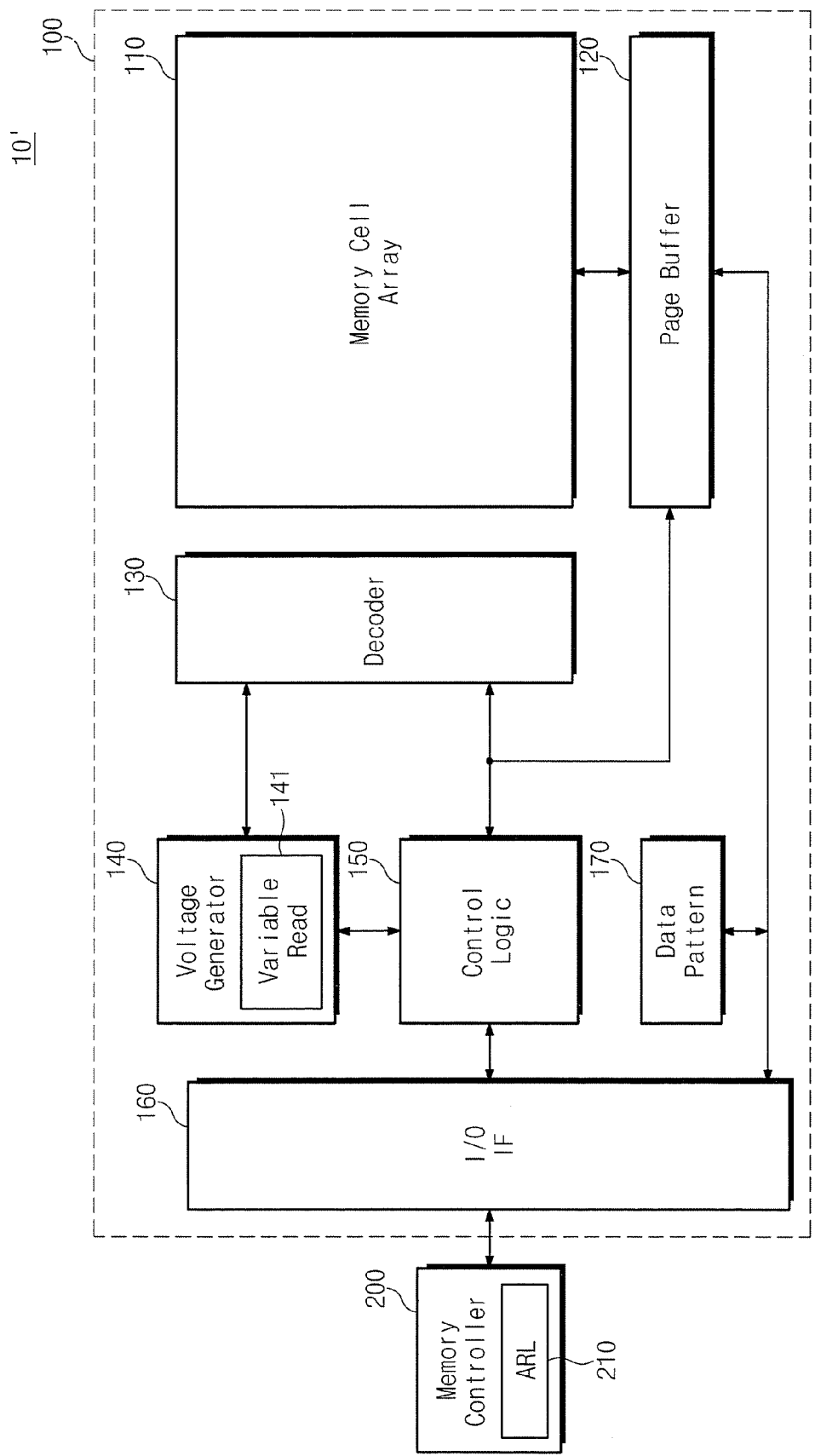

FIGS. 1A and 1B are block diagrams of a memory systems 10, 10' according to some embodiments of the present invention. The memory system 10 of FIG. 1A includes a flash memory device 100 and a memory controller (or flash controller) 200. A control logic circuit 150 of the flash memory device 100 shown in FIG. 1A includes an adaptive read voltage level (ARL) circuit 151. An external memory controller 200' of the memory device 10' shown in FIG. 1B includes an ARL circuit 210. The memory system 10 shown in FIG. 1A is operable by controlling a read voltage level through the ARL circuit 151 of the control logic circuit 150. The memory system 10' shown in FIG. 1B is operable by controlling a read voltage level through the ARL circuit 210 of the external memory controller 200. The memory systems 10, 10' of FIGS. 1A and 1B are substantially the same, except for the locations of the ARL circuits 151 and 210. Therefore, the structural configuration shown in FIG. 1A will be representatively described hereinafter without duplication.

In some embodiments of the present invention, the flash memory device 100 may be a NAND-type flash memory device, but other embodiments may utilize other types of flash memory configurations. As illustrated in FIG. 1A, the flash memory device 100 includes a memory cell array 110 configured to store M-bit data information (M is 1 or a positive integer larger than 1). The memory cell array 110 may be arranged into pluralities of storage regions. These memory regions may include pluralities of a data fields configured to store normal data and a spare data field. Each storage region of the memory cell array 110 may include plural memory blocks. Configurations of memory blocks known by those skilled in the art may be used, and internal details of the memory blocks will not be further described.

The flash memory device 100 includes a page buffer 120, a decoder 130, a voltage generator 140, the control logic circuit 150, and an input/output interface circuit 120. The page buffer 120 is configured to read/program data from/into the memory cell array 110 under control by the control logic circuit 150. The decoder 130 is controlled by the control logic circuit 150, selecting a memory block of the memory cell array 110 and designating a word line of the selected memory block. A selected word line is driven with a word line voltage supplied from the voltage generator 140. The voltage generator 140 is controlled by the control logic circuit 150, generating word line voltages (e.g., read voltage, program voltage, pass voltage, verifying voltage, etc.) to be supplied into the memory cell array 110. The voltage generator 140 includes a variable read voltage generator 141 for generating the read voltage, which varies in order to discriminate data states. The read voltage generator 141 operates to gradually increase/decrease the read voltage by an increment/decrement in response to control by the control logic circuit 150. The control logic circuit 150 is configured to control general operations of the flash memory device 100.

The external memory controller 200 is configured to control the flash memory device 100 in response to a request by an external device (e.g., a host). The memory controller 200 may include a processing unit, such as central processing unit (CPU) or microprocessor, an error check/correction (ECC) circuit, a buffer memory, and other components.

The flash memory device 100 further includes a data pattern reservoir 170 configured to store a data pattern to be programmed into a reference block 111. The data pattern reservoir 170 is configured to store a data pattern to be programmed into the data or spare field of the memory cell array 110. The data pattern reservoir 170 can be implemented in a register made of, for example, read-only memory (ROM) or static random access memory (SRAM). If the data pattern reservoir 170 includes SRAM, a data pattern can be properly stored in the memory cell array 110. A data pattern stored in the memory cell array 110 can be loaded into the data pattern reservoir 170 if necessary. In various embodiments, the data pattern reservoir 170 may be settled in the external memory controller 200 outside of the flash memory device 100. Thus, some embodiments of the present invention may offer an advanced function capable of detecting the maximum value of threshold voltage distribution and configuring a read voltage level in accordance with a result of the detection.

Figure 2:
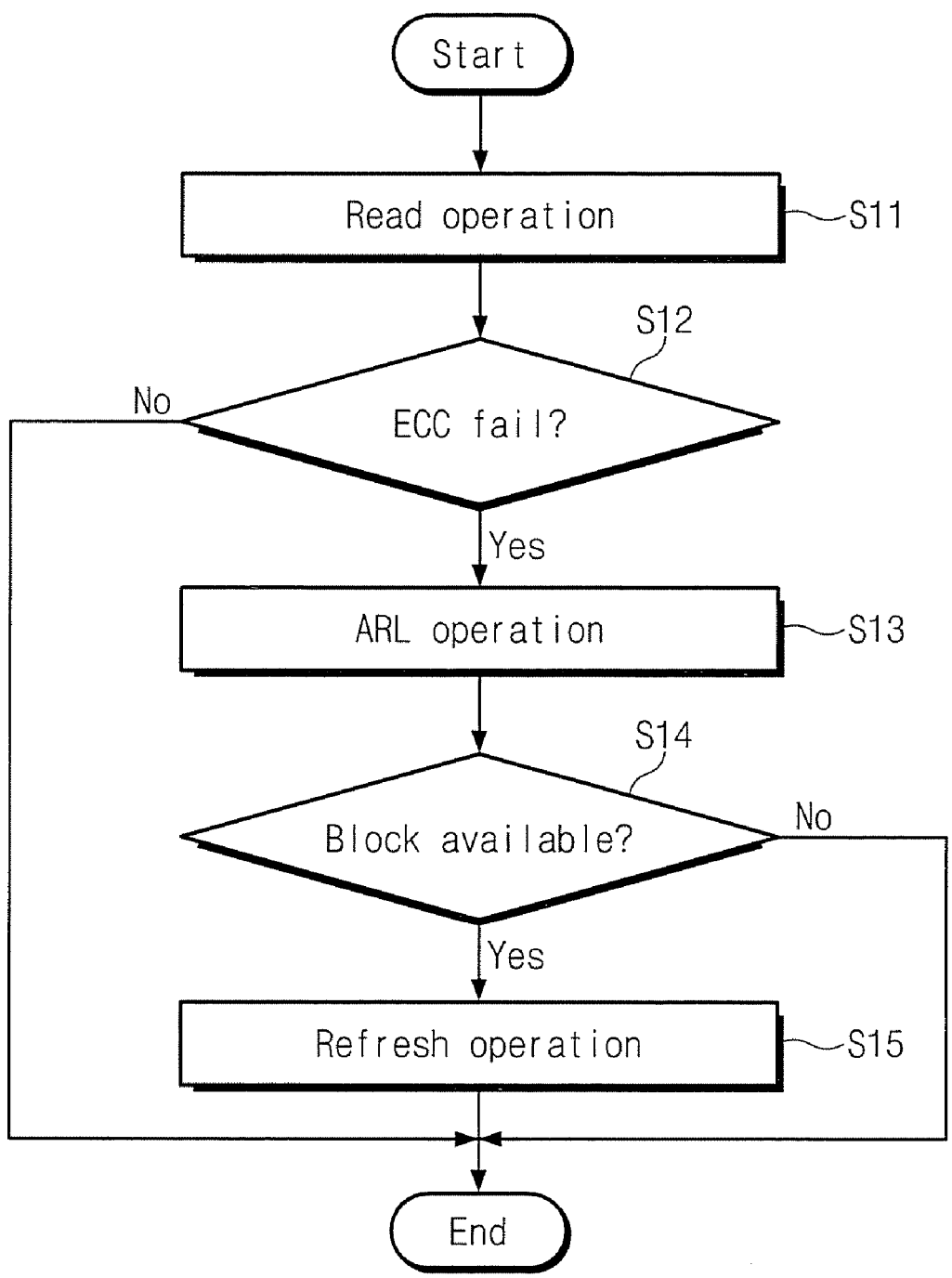
FIG. 2 is a flow chart showing a reading method of the memory cell array shown in FIG. 1A or 1B.

FIG. 2 is a flow chart showing a reading method applicable to the flash memory devices 100, 100' of FIGS. 1A and 1B. Referring to FIGS. 1A (or 1B) and 2, a method for reading data from the flash memory device 100, 100' includes the steps of: reading data from the memory cell array 110 (S11); repairing the read data by means of an ECC block and determining whether there is data unable to be repaired by the ECC block (S12); terminating the procedure after output of the read data if it is possible to repair the read data by the ECC block or modifying the read voltage level (ARL) if it is impossible to repair the read voltage by the ECC block (S13); checking up whether there is a unused block in the memory cell array 110 (S14); and conducting a refreshing (i.e., reprogramming) operation if there is a unused block in the memory cell array.

Figure 3:
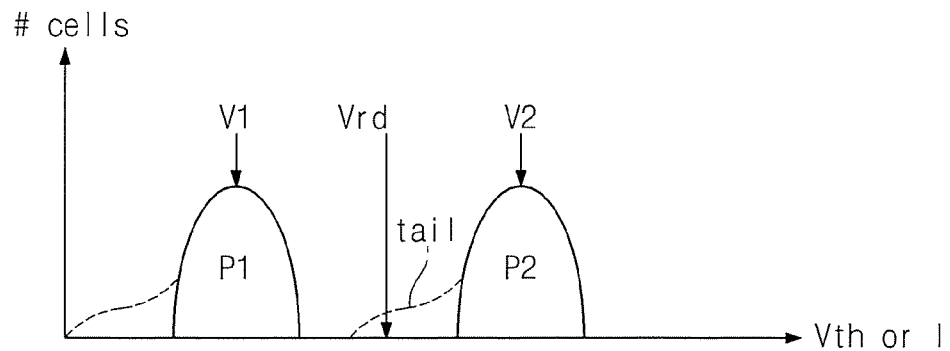
FIG. 3 is a graphic diagram depicting read voltage levels according to some embodiments of the present invention.

FIG. 3 is a diagram depicting read voltage levels according to some embodiments of the present invention. The flash memory device 100 shown in FIG. 1 includes the memory cell array 110 for storing M-bit data information (M is 1 or a positive integer larger than 1). For instance, assuming that a unit memory cell stores 2-bit data, the memory cells according to some embodiments of the present invention may be conditioned in four threshold voltage distributions (hereinafter first, second, third and fourth threshold-voltage distributions). To detect a new read voltage level, maximum values respective to the threshold voltage distributions are determined. The new read voltage level can be set at an intermediate value between the maximum values of adjacent threshold voltage distributions. Otherwise, the new read voltage level may be arbitrarily configured from considering the maximum values of adjacent threshold voltage distributions. Further, by evaluating displacement between the maximum values of threshold voltage distributions changed from the prior maximum values of threshold voltage distributions due to stress by various reasons, it is also possible for the new read voltage level to be set on a value that is obtained by subtracting the displacement from a previous read voltage level.

Referring to FIG. 3, the first threshold-voltage distribution P1 corresponds to a first programmed state and the second threshold-voltage distribution P2 corresponds to a second programmed state. In the first and second threshold-voltage distributions P1 and P2, the threshold voltages of memory cells may be partly lowered due to stress. If the threshold voltages of the memory cells become lower, there may be tail bits. In reading operations according to some embodiments of the present invention, reading is carried out by detecting the maximum values of the first and second threshold-voltage distributions P1 and P2, and then by configuring (or setting) the new read voltage level based on an average of the two maximum values. For example, assuming that V1 is the maximum value of the first threshold-voltage distribution P1 and V2 is the maximum value of the second threshold-voltage distribution P2, the modified read-voltage level can be set at an average of V1 and V2. Otherwise, the modified read-voltage level may be configured by arbitrarily considering V1 and V2. Flash memory devices may be capable of correcting errors caused by a tail bits by use of an ECC block. In cases where such correction is not possible, some embodiments of the present invention may correct errors by using an ARL scheme.

Figure 4A:
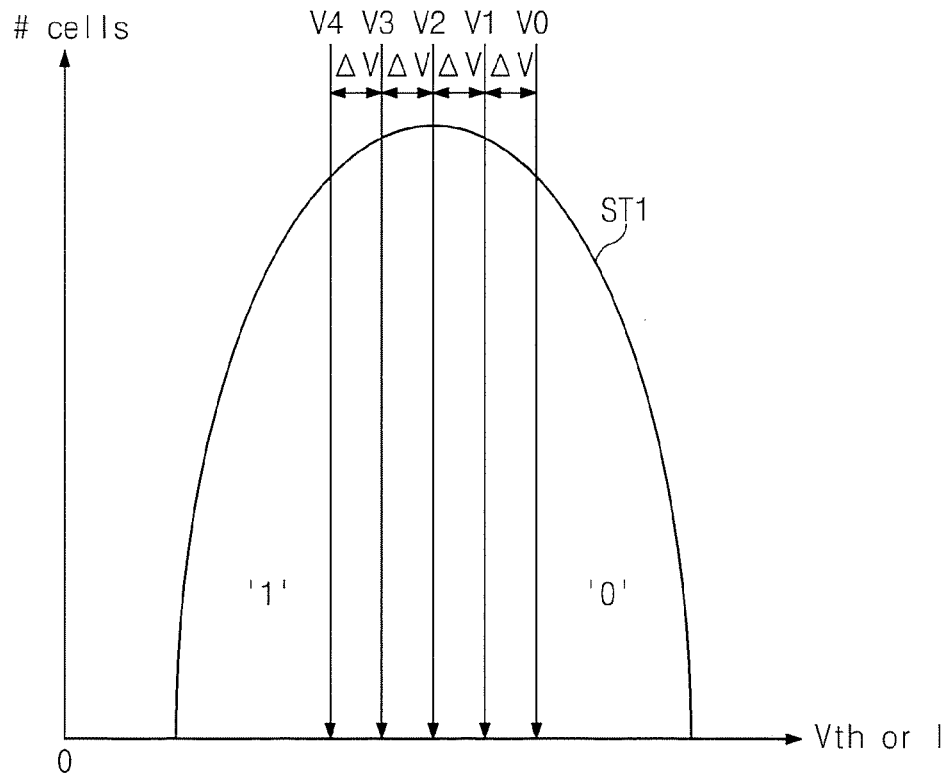
FIGS. 4A and 4B are graphic diagrams showing the maximum values of threshold voltage distributions according to some embodiments of the present invention.
Figure 4B:
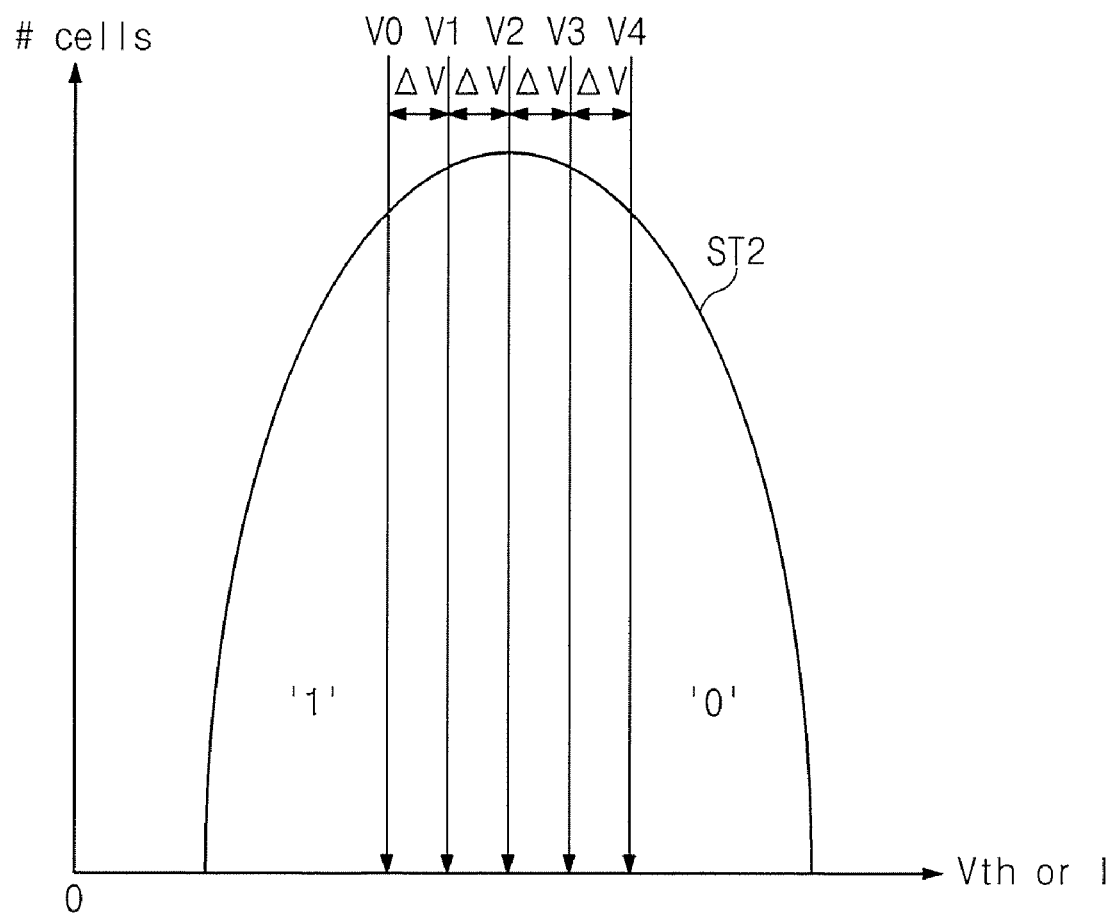
Figure 5A:
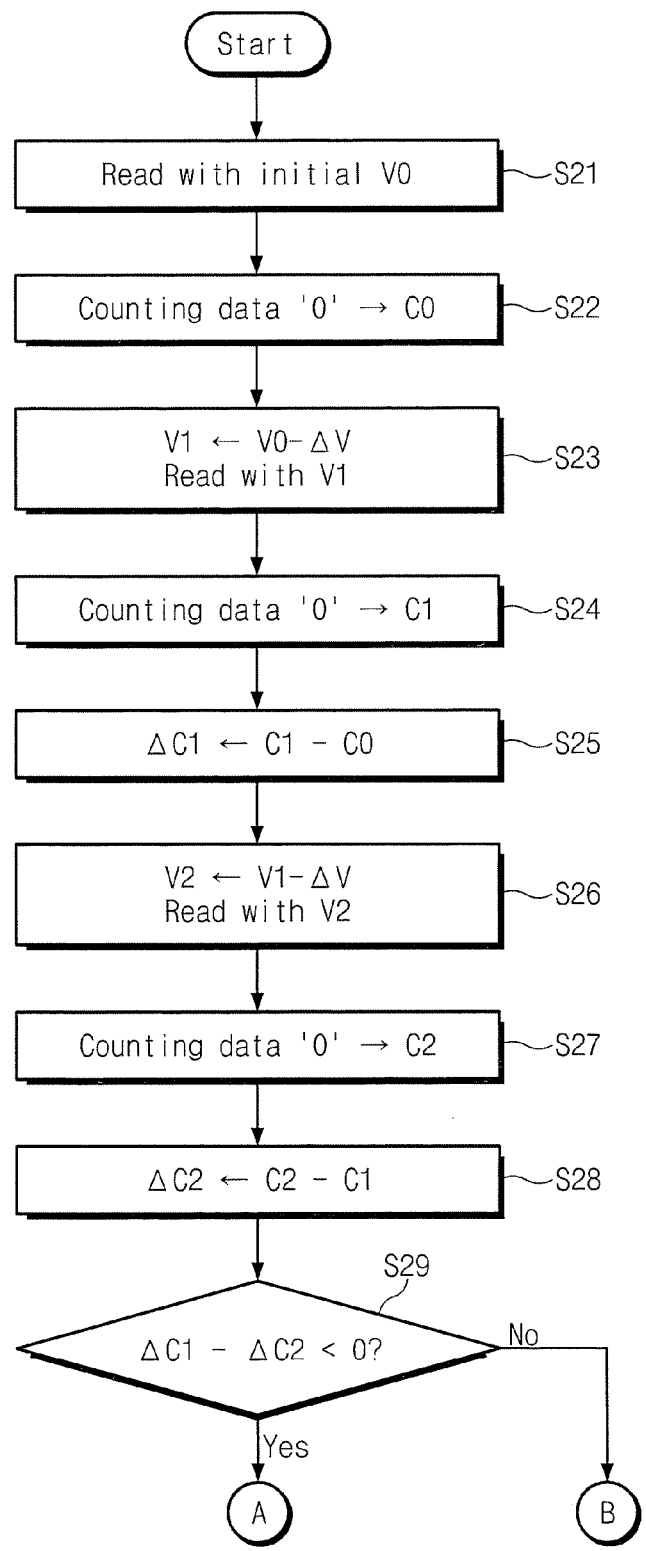
FIGS. 5A through 5C are flow charts showing a procedure of finding the maximum values noticed by FIGS. 4A and 4B.
Figure 5B:
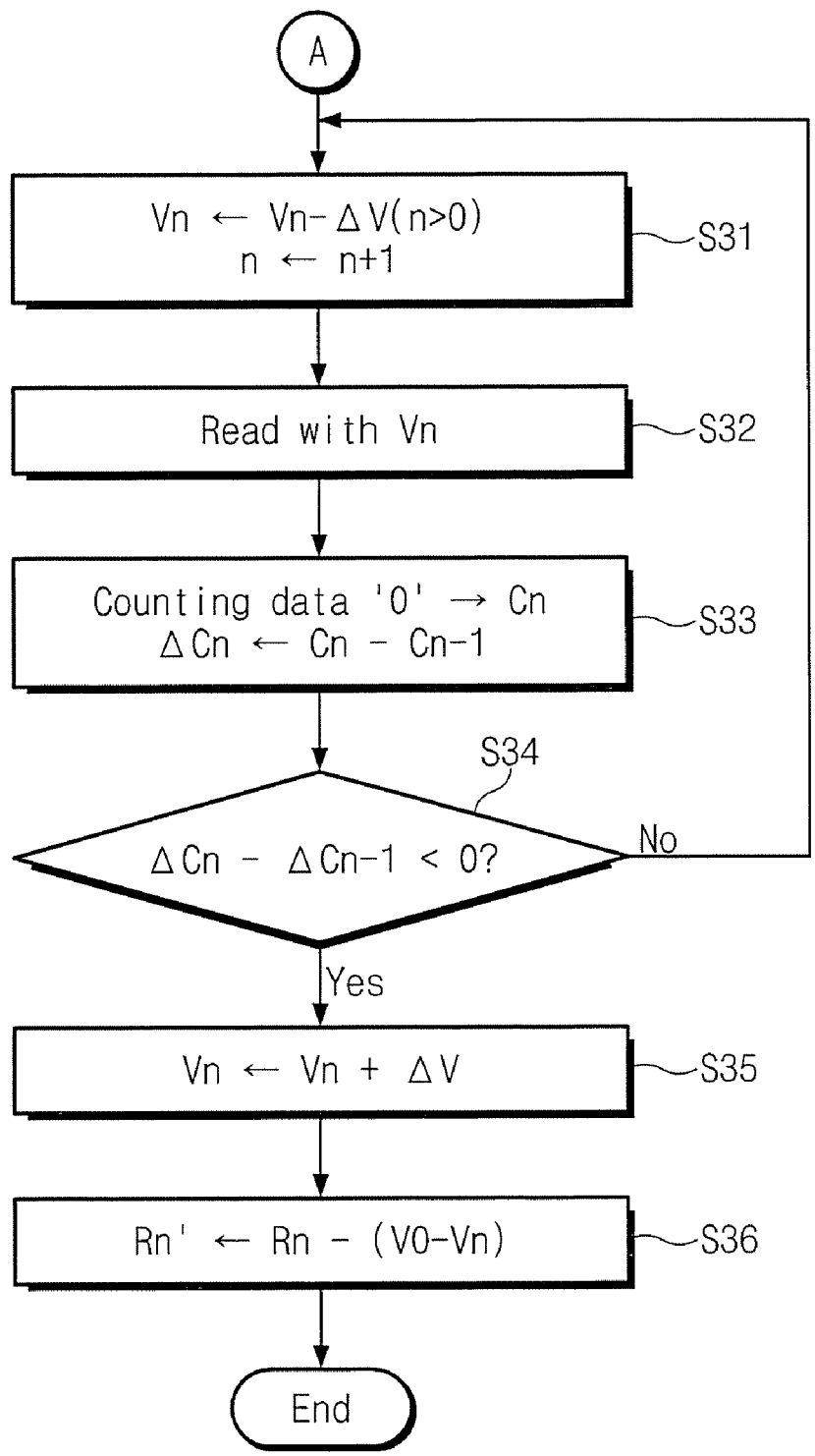
Figure 5C:
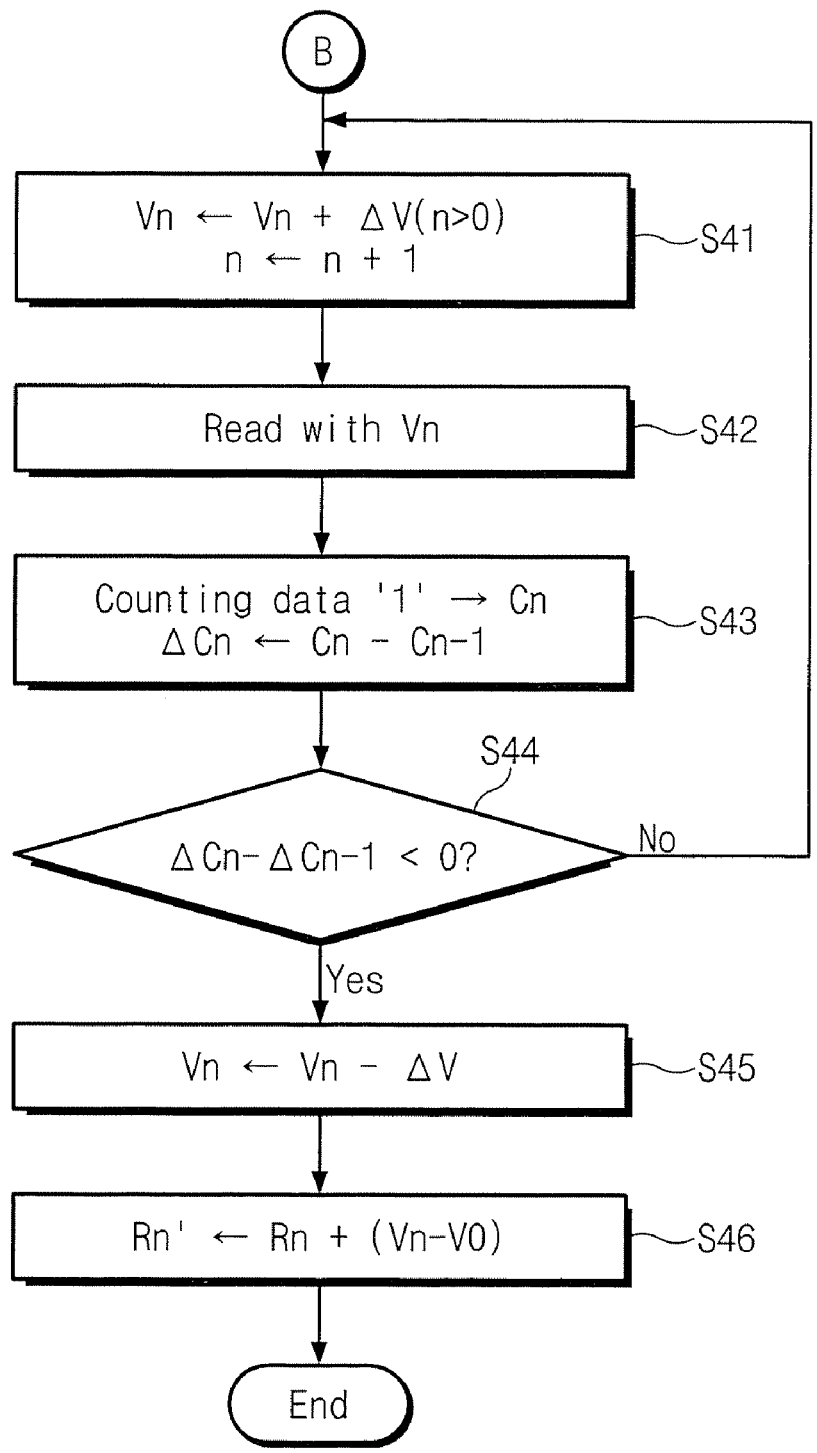

Techniques for finding maximum value of threshold voltage distributions will be now detailed in conjunction with FIGS. 4A through 5C. FIGS. 4A and 4B are graphic diagrams showing the maximum values of threshold voltage distributions according to some embodiments of the present invention, and FIGS. 5A through 5C are flow charts showing operations for finding the maximum values illustrated by FIGS. 4A and 4B.

Referring to FIGS. 4A and 4B, due to stress by various reasons, the threshold voltages of memory cells would be partly lower (FIG. 4A) or higher (FIG. 4B). In other words, the graph of FIG. 4A illustrates a threshold voltage distribution ST1 shifted to the left with respect to a reference voltage V0, while the graph of FIG. 4B illustrates a threshold voltage distribution ST2 shifted to the right from the reference voltage V0. In the graphs of FIGS. 4A and 4B, the X-axes denote voltage while the Y-axes denote the numbers of memory cells. On the domain of read voltages V0, V1, V2, and V4, the right side corresponds to data "0" and the left side corresponds to data "0". The read voltages V0~V4 are separated by a voltage gap $\Delta V$.

The flow chart shown in FIG. 5A illustrates operations to determine whether the threshold voltage distribution has shifted to left or right from the reference voltage V0. The flow chart of FIG. 5B illustrates operations for finding the maximum value of the threshold voltage distribution ST1 if the threshold voltage distribution has shifted to left from the initial read voltage V0. The flow chart of FIG. 5C illustrates operations for finding the maximum value of the threshold voltage distribution ST2 if the threshold voltage distribution has shifted to right from the initial read voltage V0.

Referring to FIGS. 4A and 5A, the initial read voltage V0 may be equivalent to the maximum value of the prior threshold-voltage distribution, or the initial read voltage V0 may be set at an arbitrary level. In finding (detecting) the maximum value of the threshold voltage distribution, a read operation begins (S21) at the initial read voltage V0. The number of memory cells detected as verified is counted and the count is stored as C0 (S22). After a read voltage V1 is used (S23). The number of data "0" is counted with reference to the first read voltage V1 and stored as C1 (S24). C0 is subtracted from C1, with the result being stored as $\Delta C1$ (S25). Thereafter, read operations are carried out with a read voltage V2 (S26). The number of memory cells read as data "0" is counted with reference to the second read voltage V2 and stored as C2 (S27). C1 is subtracted from C2, and the result stored as $\Delta C2$ (S28).

$\Delta C2$ is compared to $\Delta C1$ (S29). If $\Delta C1$ is greater than $\Delta C2$, the threshold voltage distribution is shifted to right as shown in FIG. 4A. If $\Delta C1$ is less than $\Delta C2$, the threshold voltage distribution shifts to left as shown in FIG. 4B. If $\Delta C1$ is larger than $\Delta C2$, the procedure goes to the stage A. If $\Delta C1$ is less than $\Delta C2$, operations proceed to a stage B. If $\Delta C1$ is greater than $\Delta C2$, the maximum value of the threshold voltage distribution is found by shifting the read voltage right (increasing) by $\Delta V$. If $\Delta C1$ is smaller than $\Delta C2$, the maximum value of the threshold voltage distribution is found out by shifting the read voltage left (decreasing) by $\Delta V$.

Referring to FIGS. 4A and 5B, assuming that the threshold voltage distribution has moved to right, a next read voltage Vn is shifted to the left (decreased) by $\Delta V$ (S31), and a read operation is carried out with using the new read voltage Vn (S32). The number of data "0" is counted and stored as Cn, from which a previously determined number of data Cn−1 is subtracted to produce a result stored as $\Delta Cn$ (S33). If $\Delta Cn$ is larger than $\Delta Cn-1$, operations return to step S31, and steps S32 and S33 are repeated. If $\Delta Cn$ is smaller than $\Delta Cn-1$, Vn−1 corresponds to the maximum value of the threshold voltage distribution. $\Delta V$ is added to Vn−1 (S35). A new read voltage level Rn is obtained by subtracting a gap of V0-Vn from the prior read voltage level Rn' (S36).

Now referring to FIGS. 4B and 5C, assuming that the threshold voltage distribution has moved to right, the read voltage Vn is shifted to the right (increased) by ΔV (S41). A read operation is carried out with the read voltage Vn (S42), and a number of failed memory cells (data value "1") is counted and stored as Cn, and a difference between Cn−1 and Cn is stored as ΔCn (S43). If a comparison of ΔCn and ΔCn−1 (S44) indicates that ΔCn is greater than ΔCn−1, operations return to step S41 and steps S41-S44 are repeated. If ΔCn is smaller than ΔCn−1, Vn−1 corresponds to the maximum value of the threshold voltage distribution, and ΔV is added to Vn−1 (S45). Hence, a new read voltage level Rn is obtained by subtracting a voltage equal to V0-Vn from the prior read voltage level Rn' (S46).

The way of detecting (or finding) the maximum value of the threshold voltage distribution (or data state) can be reduced through internal commands by means of the ARL circuit 151 shown in FIG. 1A, or by means of the ARL circuit 210 included in the memory controller 200 shown in FIG. 1B.

Some embodiments of the present invention may configure a read voltage level (i.e., using ARL circuitry) even if there is a tail bit on the threshold voltage distribution. Further, some embodiments of the present invention are able to use dummy cells for storing reference data or normal memory cells in order to configure the modified read-voltage level. Some embodiments of the present invention may optimize a read voltage level for each block.

Figure 6:
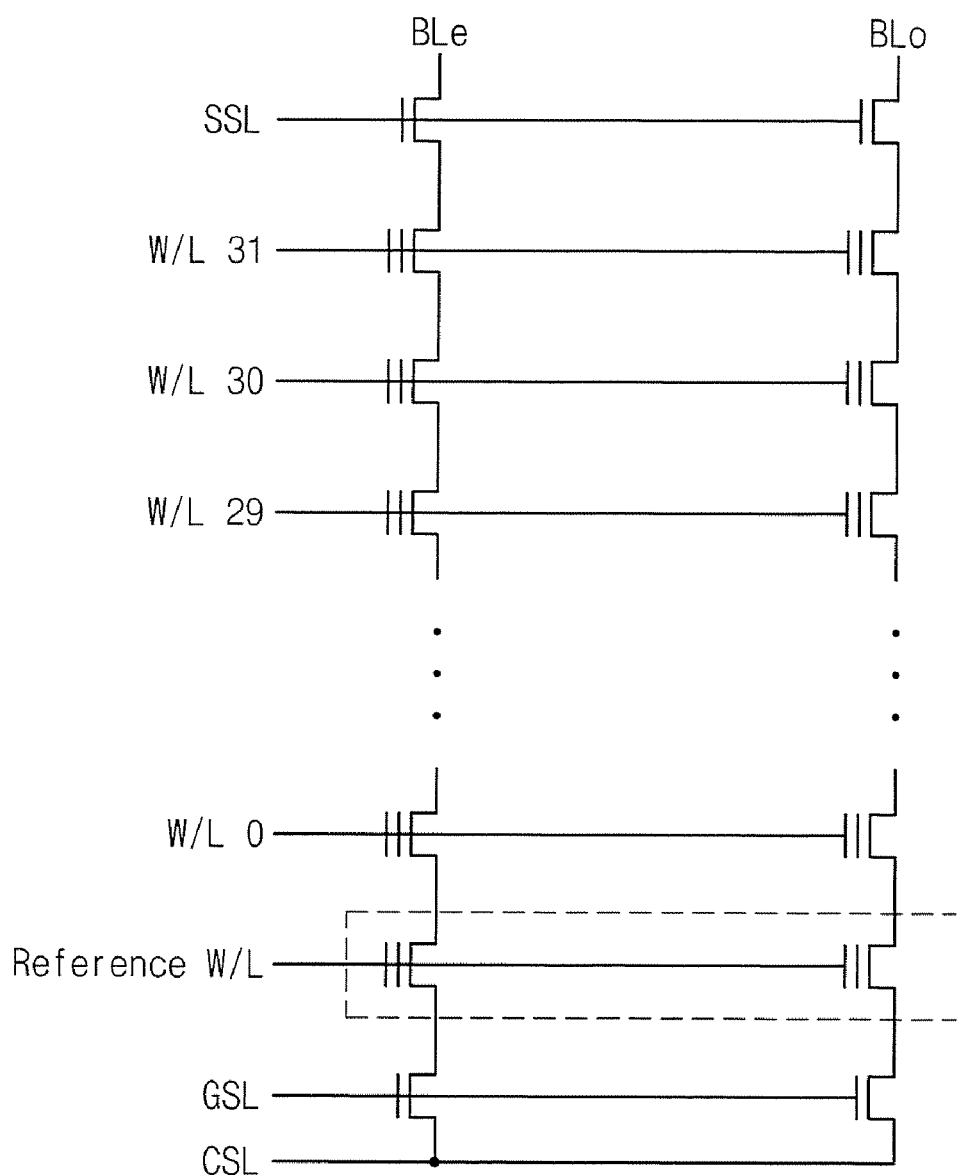
FIG. 6 is a circuit diagram of cell strings including a reference word line according to some embodiments of the present invention.
Figure 7:
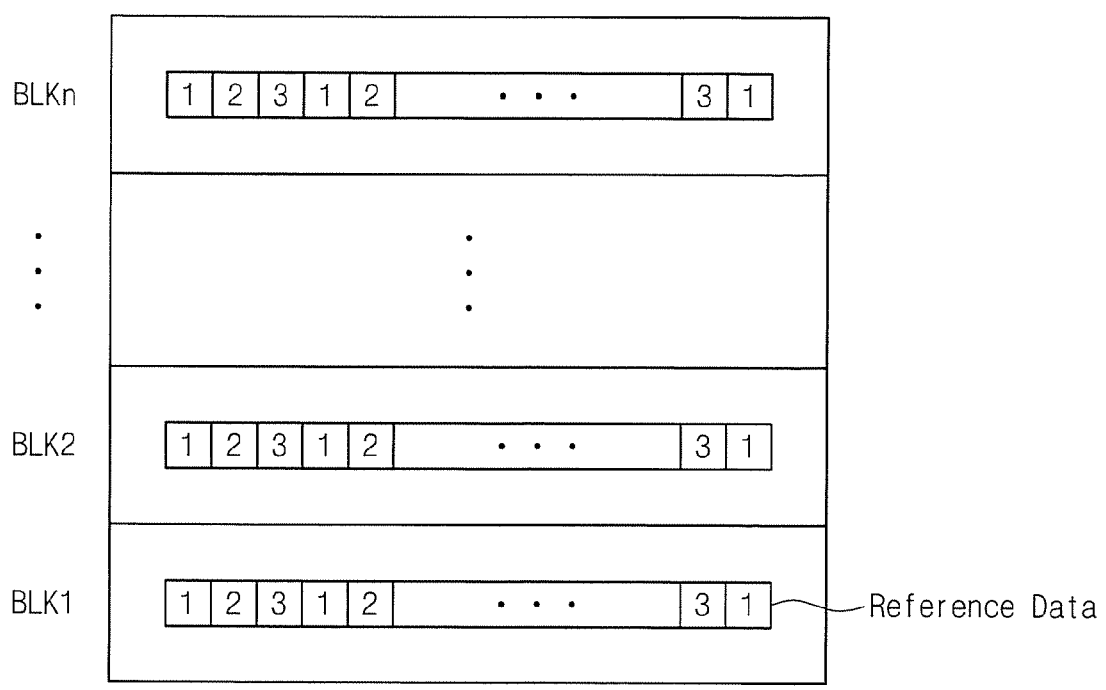
FIG. 7 is a block diagram of a memory cell array including the reference word line according to some embodiments of the present invention.
Figure 8:
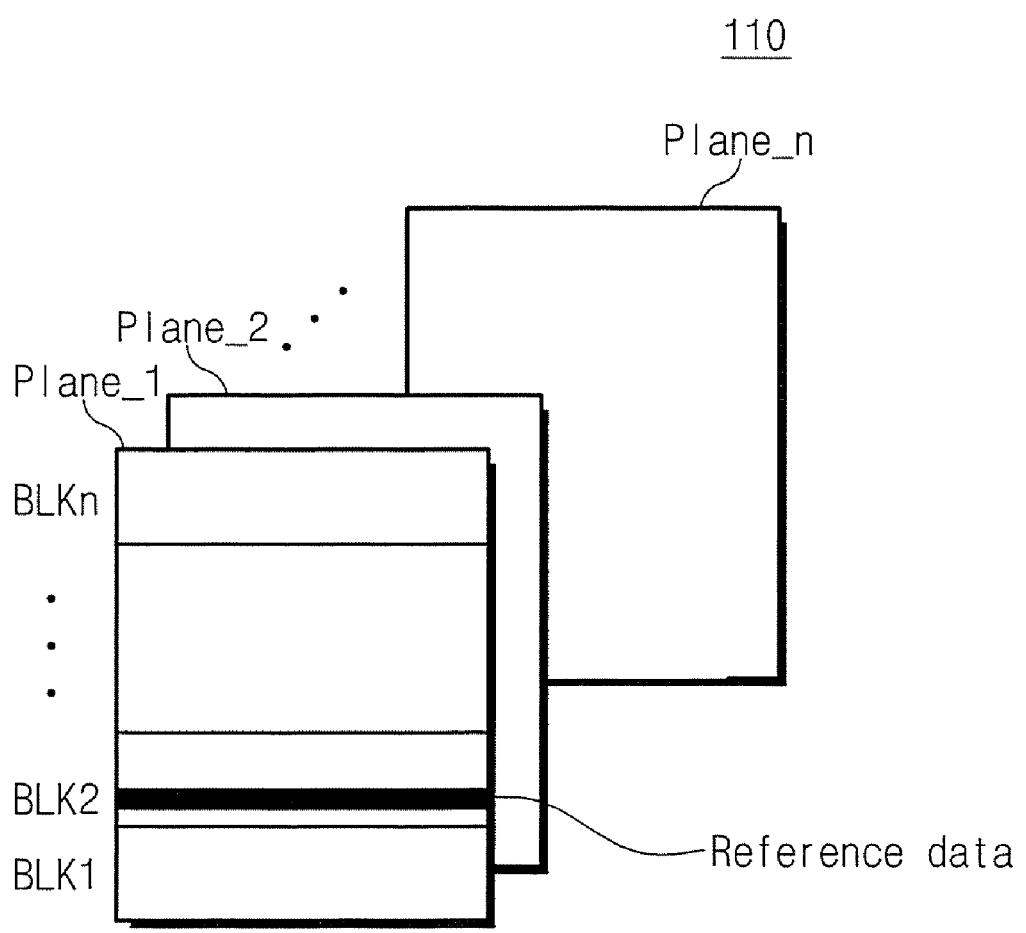
FIG. 8 is a block diagram of planes including the memory blocks shown in FIG. 7.

FIG. 6 is a circuit diagram of cell strings including a reference word line according to some embodiments of the present invention. FIG. 7 is a block diagram of a memory cell array 110 including the reference word line according to some embodiments of the present invention. FIG. 8 is a block diagram of planes including the memory blocks shown in FIG. 7.

Referring to FIG. 6, even and odd cell strings are associated with the reference word line. The reference word line may be coupled to dummy cells or normal cells additionally arranged thereat.

Referring to FIGS. 6 through 8, the reference word line may be included each in data blocks or only in a specific block (e.g., a reference block). The cells of the reference word line may store predetermined data (i.e., reference data) or reference data of a spare block.

By reading data from the cells of the reference word line, it is possible to predict the threshold voltage distribution of another normal block or other normal memory cells. If there is an error from the prior read voltage level while reading data from the cells of the reference word line, a memory system according to some embodiments of the present invention may modify the read voltage level. A memory system according to some embodiments of the present invention may read data from the memory cell array using the modified read-voltage level.

Referring to FIG. 8, a memory cell array 110 according to some embodiments of the present invention includes a plurality of planes. Each plane includes a plurality of blocks. At least one of the planes may include reference data.

Figure 9:
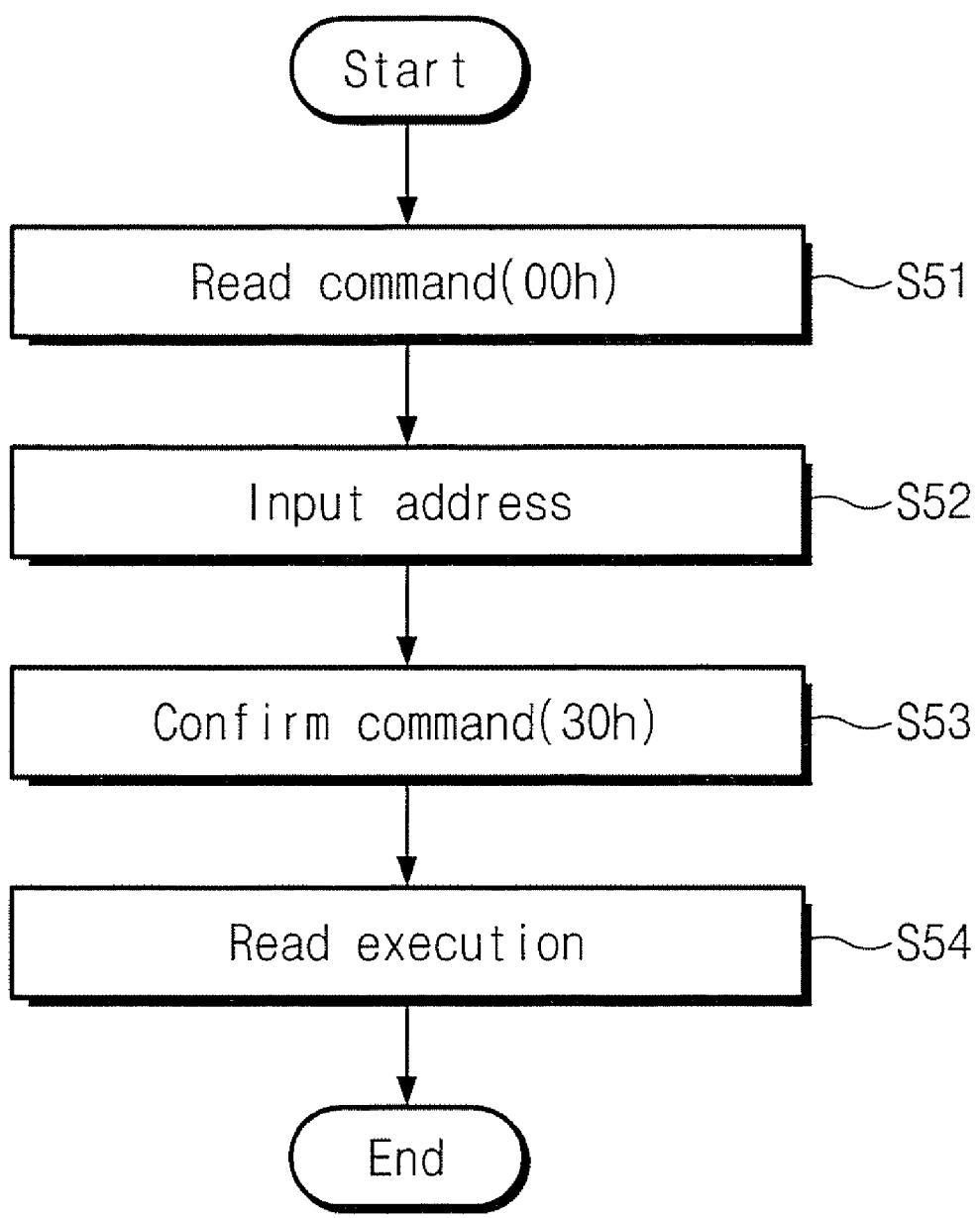
FIG. 9 is a flow chart showing a general reading procedure of a flash memory.

FIG. 9 is a flow chart showing operation for reading a flash memory. Referring to FIG. 9, a command "00h" is input in a first cycle (S51). An address of the flash memory array is input (S52). A command "30h" is input in a second cycle (S53). A read operation is executed (S54).

Figure 10:
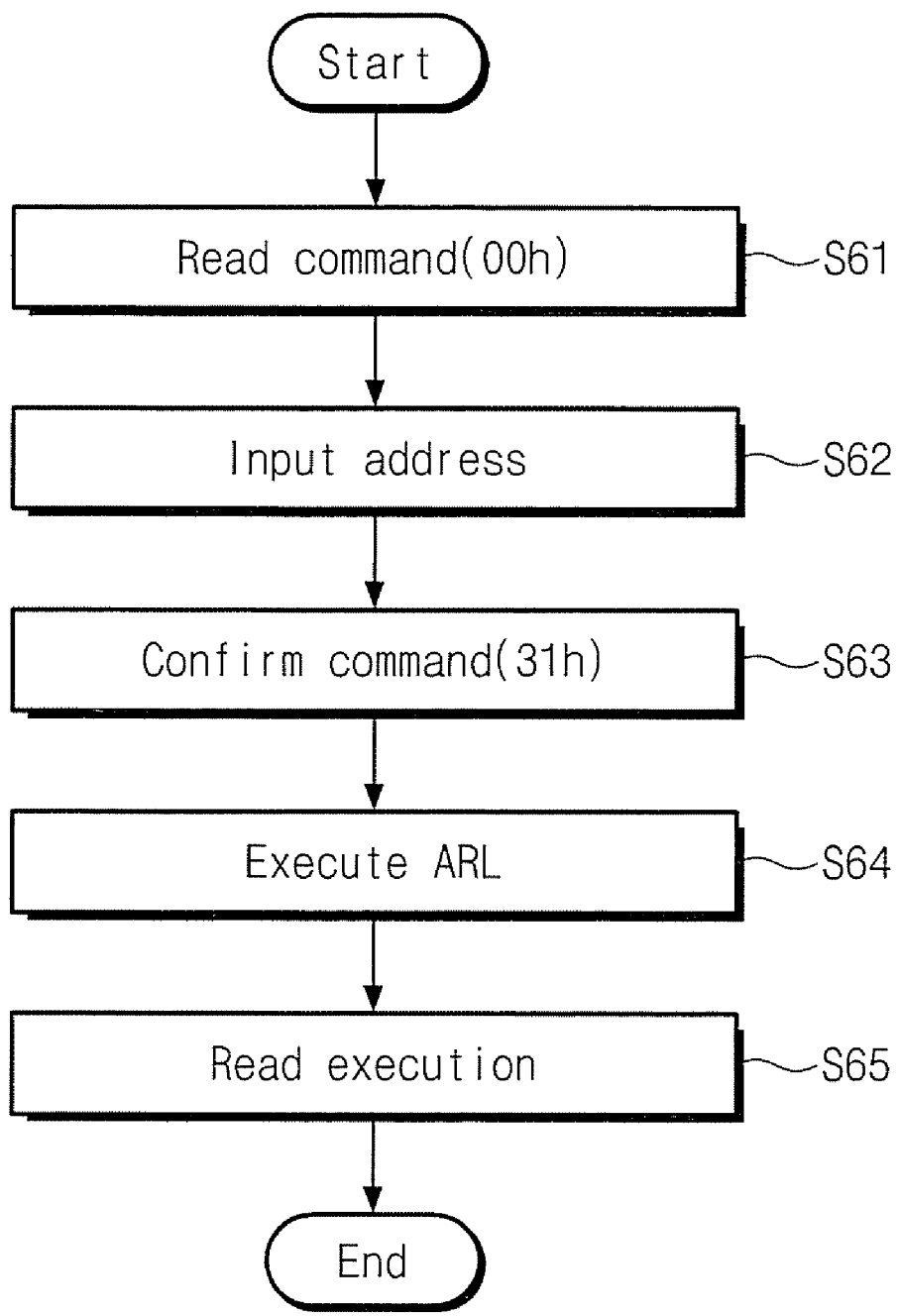
FIG. 10 is a flow chart showing a reading procedure according to some embodiments of the present invention.

FIG. 10 is a flow chart illustrating reading operations according to further embodiments of the present invention. Referring to FIGS. 1A and 10, the memory controller 200 inputs a command "00h" to the flash memory device 100 in the first cycle (S61). The memory controller 200 also inputs an address to the flash memory device 100 (S62). The memory controller 200 inputs a command "31h" to the flash memory device 100 in a second cycle (S63). For example, a command "31h" may be used for configuring the read voltage level modified by the memory device 100. The flash memory device 100 detects the maximum value of the threshold voltage distribution corresponding to reference data, and modifies the read voltage dependent on a result of the detection (S64). The memory device 100 conducts a reading operation using the modified read-voltage level (S65). The steps S61-S63 are carried out by the memory controller 200 and the steps of S64-S65 are carried out by the memory device 100. In read operations according to these embodiments of the present invention, the read voltage level is newly configured when there is an additional input of the read command "31h".

Flash memory devices are typically able to keep data stored therein even without power supply. With the rapid increase of the use of mobile apparatuses, such as cellular phones, personal digital assistants (PDA), digital cameras, portable gaming consoles, and MP3 players, flash memory devices are widely employed for code and data storage. Flash memory devices may be also utilized in other applications, such as high-definition televisions (HDTV), digital versatile disks (DVD), routers, and global positioning systems (GPS).

Figure 11:
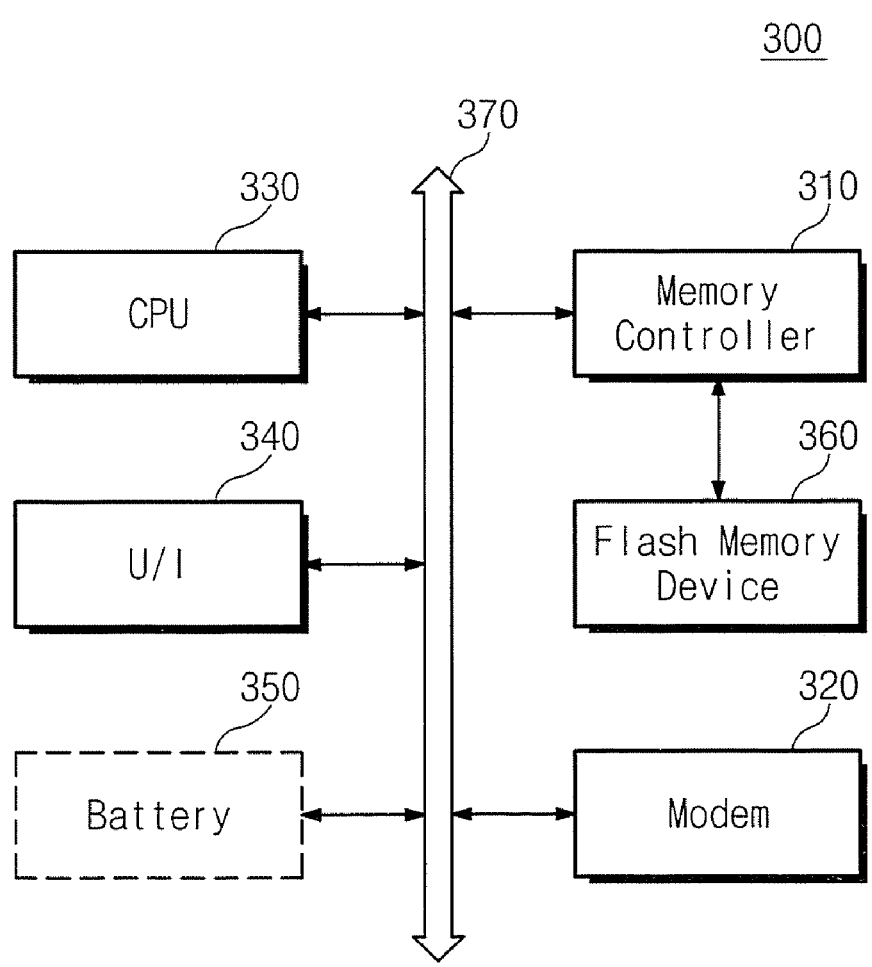
FIG. 11 is a block diagram of a computing system including a memory system according to some embodiments of the present invention.

A computing system 300 including a flash memory system according to some embodiments of the present invention is schematically illustrated in FIG. 11. The computing system 300 includes a microprocessor (CPU) 330, a user interface 340, a modem 320 (e.g., a baseband chipset), a memory controller 310, and a flash memory device 360, all of which are connected to each other by a bus 370. The memory controller 310 operates to control the flash memory device 360. In the flash memory device 360, N-bit data (where N is a positive integer) processed or to be processed by the CPU 330 may be stored through the memory controller 310. If the computing system 300 shown in FIG. 11 is incorporated in a mobile apparatus, it may further include a battery 350 for supplying power thereto. Although not shown in FIG. 11, the computing system 300 may be further equipped with other components, such as an application chipset, a camera image processor (e.g., complementary metal-oxide-semiconductor (CMOS) image sensor; i.e., CIS), a mobile DRAM, etc. The memory controller 410 and the flash memory device 460, for example, may serve as parts of a solid state drive/disk (SSD) using a nonvolatile memory for storing data. An exemplary SSD is disclosed in U.S. Patent Application Publication No. 2006/0152981, the disclosure of which is incorporated herein by reference. The memory controller 310 and the flash memory device 360 may also serve as parts of a memory card using a nonvolatile memory for storing data.

Figure 12:
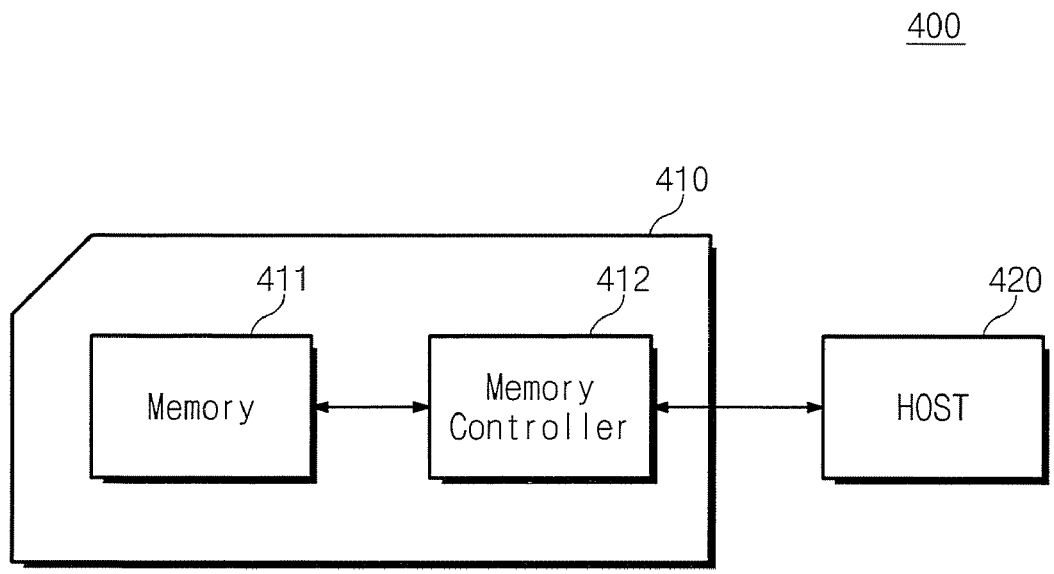
FIG. 12 is a block diagram of a memory-based storage system according to some embodiments of the present invention.

FIG. 12 is a block diagram of a memory-based storage system 400 according to some embodiments of the present invention. The memory-based storage system 400 is implemented in the form of a card 410 including a memory 411 and a memory controller 412. For instance, the card 410 may be a standard-form card for use in electronic apparatus, such as digital cameras, personal computers, and so on. The memory controller 412 controls the memory 411 in response to control signals received from a host 420 connected to the card 410.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of operating a nonvolatile memory device, the method comprising:
   storing reference data in a plurality of memory cells;
   reading the plurality of memory cells using a first read voltage;
   determining a first number of cells meeting a predetermined criterion in response to the reading of the plurality of memory cells using the first read voltage;
   reading the plurality of memory cells using a second read voltage differing from the first read voltage by a predetermined voltage difference;
   determining a second number of cells meeting the predetermined criterion responsive to the reading of the plurality of memory cells using the second read voltage;
   determining a maximum value of a threshold voltage distribution of the plurality of memory cells responsive to a comparison of the first number of cells and the second number of cells; and
   modifying a read voltage of the nonvolatile memory device based on the determined maximum value of the threshold voltage distribution.

2. The method of claim 1, wherein the nonvolatile memory device includes a plurality of data blocks and a plurality of spare blocks, and wherein the spare blocks are configured to store the reference data.

3. The method of claim 1, wherein the nonvolatile memory device includes a NAND flash memory cell array.

4. A method of operating a nonvolatile memory device, the method comprising:
   storing reference data in a plurality of memory cells;
   reading the reference data;
   detecting a first maximum value of a first threshold voltage distribution and a second maximum value of a second threshold voltage distribution responsive to reading the reference data; and
   modifying a read voltage of the nonvolatile memory device based on the first and second maximum values.

5. The method of claim 4, wherein modifying the read voltage based on the first and second maximum values comprises:
   determining an average of the first and second maximum values; and
   modifying the read voltage based on the determined average.

6. A method of operating a nonvolatile memory device, the method comprising:
   determining whether data read from the nonvolatile memory device is correctable by error correction coding (ECC); and
   for data that is not correctable by ECC performing the following:
   storing reference data in a plurality of memory cells of the nonvolatile memory device;
   reading the plurality of memory cells using a first read voltage;
   determining a first number of cells meeting a predetermined criterion in response to the reading of the plurality of memory cells using the first read voltage;
   reading the plurality of cells using a second read voltage differing from the first read voltage by a predetermined voltage difference;
   determining a second number of cells meeting the predetermined criterion responsive to the reading of the plurality of cells using the second read voltage;
   determining a maximum value of a threshold voltage distribution of the plurality of memory cells responsive to a comparison of the first number of cells and the second number of cells; and
   modifying a read voltage of the nonvolatile memory device based on the determined maximum value of the threshold voltage distribution.

7. A nonvolatile memory device, comprising:
   a first plurality of memory cells;
   a second plurality of memory cells; and
   a memory control circuit configured to store reference data in the first plurality of memory cells, to read the first plurality of memory cells using a first read voltage, to determine a first number of cells meeting a predetermined criterion in response to the reading of the first plurality of memory cells using the first read voltage, to read the first plurality of cells using a second read voltage differing from the first read voltage by a predetermined voltage difference, to determine a second number of cells meeting the predetermined criterion responsive to the reading of the first plurality of cells using the second read voltage, to determine a maximum value of a threshold voltage distribution of the first plurality of memory cells responsive to a comparison of the first number of cells and the second number of cells and to control a read voltage applied to the second plurality of memory cells based on the determined maximum value of the threshold voltage distribution.

8. A nonvolatile memory device, comprising:
   a first plurality of memory cells;
   a second plurality of memory cells; and
   a memory control circuit configured to store reference data in the first plurality of memory cells, to read the reference data, to detect a first maximum value of a first threshold voltage distribution of the first plurality of memory cells and a second maximum value of a second threshold voltage distribution of the first plurality of memory cells responsive to reading the reference data and to modify a read voltage applied to the second plurality of memory cells based on the first and second maximum values.

* * * * *